(12) United States Patent
Holte

(10) Patent No.: US 7,507,471 B1
(45) Date of Patent: Mar. 24, 2009

(54) REDUCING DUSTING OF EPOXY LAMINATES

(75) Inventor: Mark D. Holte, LaCrosse, WI (US)

(73) Assignee: Isola USA Corp, Chandler, AZ (US)

( * ) Notice: Subject to any disclaimer, the term of this patent is extended or adjusted under 35 U.S.C. 154(b) by 0 days.

(21) Appl. No.: 08/540,429

(22) Filed: Oct. 10, 1995

(51) Int. Cl.
*B32B 5/16* (2006.01)

(52) U.S. Cl. .............. 428/325; 428/327; 428/407; 428/432; 427/180

(58) Field of Classification Search ............ 428/325, 428/327, 297, 407, 432; 427/180
See application file for complete search history.

(56) References Cited

U.S. PATENT DOCUMENTS

| | | | |
|---|---|---|---|
| 3,426,101 A | 2/1969 | Ryan et al. | 525/76 |
| 4,152,477 A * | 5/1979 | Haruta et al. | 428/209 |
| 4,264,678 A * | 4/1981 | Nelsen et al. | 428/407 |
| 4,361,616 A * | 11/1982 | Bomers | 428/215 |
| 4,375,532 A * | 3/1983 | Baer | 525/310 |
| 4,770,922 A * | 9/1988 | Hatakeyama et al. | 428/211 |
| 5,190,814 A * | 3/1993 | Foster et al. | 428/327 |
| 5,216,077 A | 6/1993 | Yoshizumi et al. | 525/68 |
| 5,264,065 A | 11/1993 | Kohm | 156/307 |
| 5,356,698 A * | 10/1994 | Kawamoto et al. | 428/209 |
| 5,409,967 A | 4/1995 | Carson et al. | 523/201 |

OTHER PUBLICATIONS

B.J. Cardwell and A.F. Yee in *Polymer*, 1993, vol. 34, No. 8, p. 1695-1701.

* cited by examiner

*Primary Examiner*—Hoa T. Le
(74) *Attorney, Agent, or Firm*—McDonnell Boehnen Hulbert & Berghoff LLP

(57) ABSTRACT

Epoxy laminates, e.g. CEM-1 laminates, include polymeric particles, particularly core-shell particles having an average diameter of about 0.05 to 30 μm, which reduce the dust produced during manufacture of printed circuit boards.

16 Claims, No Drawings

REDUCING DUSTING OF EPOXY LAMINATES

BACKGROUND OF THE INVENTION

The invention relates generally to the field of laminates such as are widely used to make printed circuit boards. In one application, the invention is applied to a composite material used as a substrate for such circuit boards, designated CEM-1. These have a paper core which has been impregnated with epoxy resins and then covered with woven glass cloth which also has been impregnated with epoxy resins.

The generally recognized types of laminates are discussed in *Printed Circuits Handbook*, Coombs ed., Third Edition, McGraw-Hill Book Co., 1988. The lowest cost materials typically use phenolic resin impregnated paper (FR-2) and are used where the cost is more important than the electrical and physical performance. FR-3 is a paper composite which has been impregnated with epoxy resins rather than phenolic resins. CEM-1 is a composite which is more expensive than the FR-2 and FR-3 materials, but which provides improved electrical and physical properties. For CEM-1 an epoxy resin is used to coat paper as in FR-3, but the core is covered with glass fiber reinforced epoxy resins outer layers. It has many applications, including television sets.

Circuit boards produce epoxy resin dust when they are punched, cut, or drilled during fabrication of printed circuit boards. This is particularly true for CEM-1 circuit boards since holes are punched in them and the impregnated paper reinforcing material is brittle. Dust is undesirable for various reasons, but particularly because it affects the precision with which circuit patterns are made. The present invention provides a means to significantly reduce the amount of dust produced, with the attendant advantages in manufacturing printed circuit boards.

SUMMARY OF THE INVENTION

The invention in one aspect is a method of reducing dust formation during the manufacture of printed circuit boards by incorporating in the electrical insulating substrates up to about 25 wt. % of polymeric particles having an average diameter of about 0.05 to 30 µm. Preferably, the particles are core-shell particles in which a rubbery polymer core is surrounded by a harder polymer shell. A preferred particle has a core of a butadiene polymer with a shell of a methacrylate polymer. The particles should comprise about 1 to 15 weight parts per hundred of epoxy resin (phr) or about 1 to 13 wt % based on the laminate substrate.

In another aspect the invention is a laminate for printed circuit board which comprises a substrate of paper coated with epoxy resin containing up to 25 wt. % of polymeric particles having an average diameter of about 0.05 to 5 µm, which has glass fiber reinforced epoxy resin outer layers. Preferably, the particles are core-shell particles, particularly those having a core comprising a butadiene polymer and a shell comprising a methacrylate polymer. The epoxy resins used in the outer layer may be with or without such particles.

Optionally, inorganic filler particles may be added to the substrate.

In one embodiment the insulating substrate is clad with copper foil and designated CEM-1.

DESCRIPTION OF THE PREFERRED EMBODIMENTS

The addition of solid particles to epoxy resin compositions has been done to lower the cost of laminates and to gain other advantages. Inorganic particles such as clays, talc, etc. typically are less expensive than epoxy resins and may be used as fillers. They have the disadvantage that they are abrasive and cause additional wear to cutting and punching tools used in the manufacture of circuit boards. Ideally, solid particles could improve toughness of brittle materials by preventing the propagation of cracks. However, for use in epoxy resins there are a number of requirements which should be met. First, the solid particles must be compatible with the components of epoxy varnishes formulated for application to paper for making CEM-1 laminates, but more generally to other types of laminates as well. They should be resistant to aggressive solvents such as DMF and acetone. They should be of a size which permits good dispersion through the mixture. They should not be too large relative to the distance between the circuit lines since they will affect the electrical properties. They should not agglomerate. They should not have a significant effect on high temperature tests which laminates must meet, such as solder float. Their density should be similar to that of epoxy resin so that they neither tend to settle nor float on the surface. These properties have been found to be satisfied by the polymeric particles described below.

Core-Shell Particles

Although the benefits of the present invention may be achieved with the use of particles which have a uniform composition throughout, the preferred particles are those which are commonly called "core-shell" particles. Many types are available. They are usually produced by sequential polymerization as described in many patents and articles of the Rohm and Haas Company. U.S. Pat. No. 3,426,101 describes the process in detail. A recent patent disclosing the use of such particles in amorphous aromatic polyesters to improve impact strength is U.S. Pat. No. 5,409,967. The use of such particles to provide toughening of epoxy resins also known, as is discussed in the article by B. J. Cardwell and A-F. Yee in *Polymer*, 1993, Volume 34, Number 8, p. 1695-1701.

Core-shell particles are made by suspension polymerization of a rubbery polymer in which very small seed particles (the core) are produced. Then, the shell is formed over the rubbery core by introducing a monomer which polymerizes to form a hard coating on the surface of the core. This is done under conditions which form little or no separate particles of the shell polymer, but which cause the second monomer to be formed over the core instead.

The particles generally will have an average diameter of about 0.05 to 30 µm, preferably about 0.05 to 5 µm. Although the identity of the polymers is not considered to be critical, a preferred particle has a core of butadiene crosslinked with a second monomer and covered with a shell comprising a methacrylate polymer. Such polymer particles are manufactured by Rohm and Haas and sold under the name Paraloid EXL. The butadiene polymer has good chemical resistance and high temperature performance; however, it is rubbery and the harder shell polymer is needed to minimize agglomeration and improve mixing with the epoxy resin. However, the shell polymer is more likely to be attacked by the solvents, although this may be advantageous in the present application.

Inorganic particles such as talc, wollactonite (Ca. silicate) aluminum hydroxide, and the like may be added if desired. Inorganic fillers are disclosed in U.S. Pat. No. 5,264,065 to be useful in controlling the coefficient of thermal expansion in the Z-axis of laminates, generally using 30 to 100 parts of filler per hundred of resin. Such fillers have been used in laminates for other and related purposes according to the Japanese patent applications discussed in the '065 U.S. patent. In U.S. Pat. No. 5,216,077 a rubber-modified phenolic resin is made by heating the resin to soften and to disperse rubber particles in the resin. The phenolic resin is later combined with an epoxy resin and an inorganic filler for use as an encapsulant, where it is said to have good impact resistance and thermal shock resistance.

Use of the Core-Shell Particles in Laminates

Addition of core-shell particles to epoxy laminates will reduce dusting when they are punched, cut, or drilled. However, they should not be used in amounts which adversely affect the electrical or physical properties of the laminates. A particularly useful application is found in the production of CEM-1 laminates which produce dust when holes are punched in the epoxy impregnated paper reinforcing material core.

Conventional CEM-1 laminates are made by impregnating layers of paper reinforcing material with an epoxy resin formulation and then B-staging the impregnated paper. B-staging means that the epoxy resin is partially cured so that it is not tacky and can be handled and stored for some time before being used to make a finished laminate. Such materials are often called "prepregs". After the mat has been B-staged, covering layers of prepregs made by impregnating woven glass cloth with an epoxy resin formulation are placed on either side of the B-staged paper and the composite is cured to produce a CEM-1 substrate. When assembled with copper foils and other layers of prepreg or fully cured composites, they can be cured under heat and pressure to complete the curing process (C-staged).

During the fabrication of printed circuit boards, there are many occasions when a laminate is cut, drilled, and punched, all of which operations create dust of the cured epoxy resin. Such dust is undesirable for many reasons. It will be appreciated that manufacturing of dense electronic circuits will be adversely affected by dust which accumulates on the board and which may affect the electrical continuity of the circuits or interfere with their construction. The inventors have sought and have found a method for improving the manufacturing process and reducing dusting of the epoxy resins, while at the same time not degrading the usual properties of CEM-1 composites.

Adding core-shell particles has been found to provide the needed improvement to the epoxy laminates, when the amount added is up to about 25 wt % of the laminate based on the resin content. Greater amounts could affect the physical properties adversely. Preferably, the amount used should be between about 3 and 20 wt % based on the resin content. The particle size is an important factor in obtaining the desired results. The average diameter should be between about 0.05 and 30 µm, preferably about 0.05 and 5 µm. Larger particles will be difficult to distribute uniformly throughout the epoxy resin and would be expected to weaken the structure if too large. The minimum size of the particles is not known, but is presumed to be determined by the method used to make the particles.

EXAMPLE 1

A varnish for use in a CEM-1 substrate was prepared by dissolving 166 kg of tetrabromobisphenol A (TBBPA) and 83.5 kg of novolac resin (Georgia Pacific 5833) and 1 kg of 2-methyl imidazole in 118 kg of propylene glycol monomethyl ether solvent and 119 kg of acetone. A solution was then prepared by dispersing 26 kg of Paraloid EXL 2691 (Rohm and Haas) in 43 kg of propylene glycol monomethyl ether solvent and 43 kg of acetone. The two solutions were mixed together, followed by additions of 305 kg of the diglycidyl ether of bisphenol A (DER346 Dow Chemical), 86 kg of Flexol, an epoxidized oil flexibilizer (UCC), 42 kg of antimony trioxide, and 8.9 kg of tan pigment. The varnish had a 156 second gel time at 171° C. and 100-300 centipoise viscosity (mPa·s). It contained 4 pph based on the resin of the Paraloid particles. A bleached Kraft paper weighing 8.5 grams per 64 in² (205 grams/m²) was saturated with a 16 wt. % solution of phenolic resin (Georgia Pacific 4198) in methanol. Then the paper was further saturated with the epoxy resin varnish described above. The saturated Kraft paper was B-staged in an oven at 340°-380° F. (171-193° C.) for 2-5 minutes. The B-staged material contained about 61 wt % resin and had a 15% flow.

A CEM-1 laminate was prepared by placing three sheets of the B-staged material between two sheets of a B-staged glass reinforced epoxy resin prepreg, with a layer of one ounce per square foot (305 g/m²) copper foil on one side of the composite and a 1 mil (0.0254 mm) layer of a release film on the other side. The resulting stack was placed between two stainless steel caul plates with three layers of Kraft paper on each side of the stack. The stack was heated for 90-110 minutes at 335° F. (168° C.) and with a pressure of 400-1000 psi (2758-6847 kPa). The material was cooled while still under pressure and then trimmed to the desired size before testing the physical properties.

A test had been developed for indicating the relative effects of changing additives to epoxy resin varnishes on the loss of material during cutting of a laminate panel. A test laminate panel was sheared and the depth of the material lost from the paper inner layer due to cutting was measured. (The top and bottom of the panel was a woven glass fabric reinforced epoxy which was sheared cleanly). In the present test the depth of the cavity created in the paper core was 15 mils (0.38 mm), which was less than the depth in a similar panel which contained none of the Paraloid particles

EXAMPLE 2

An epoxy resin formulation was prepared and then a solution containing Paraloid particles was added. The resulting varnish, which was similar to that of Example 1, was applied to a phenolic resin impregnated paper as in Example 1. The composition of the initial epoxy formula was:

| Component | Wt. % |
|---|---|
| propylene glycol monomethyl/ether | 12.9 |
| acetone | 13.1 |
| 2-methyl imidazole | 0.1 |
| Novolac resin (GP5833) | 9. |
| TBBPA | 17.8 |
| DER346 | 32.9 |
| Flexol | 9.3 |
| Antimony trioxide | 3.9 |
| tan pigment | 1.0 |

To 654 gms of the above epoxy formulation was added a mixture of 82 gms. of Paraloid EXL 2691 and 35 gms of antimony trioxide in 105 gms of acetone, 105 gms of propylene glycol monomethyl ether, and 35 gms of TBBPA. The resulting varnish had a viscosity of 145 cp (mPa·s) and a gel time of 160 seconds.

The resulting resin varnish contained 12.8 wt. % Paraloid EXL 2691. It was applied to a bleached Kraft paper which had been impregnated with an 8 wt. % phenolic resin and then B-stage cured by heating to 325° F. (163° C.) for 1.5-2.5 minutes.

When layers of the impregnated paper were combined with outer layers of a B-staged glass reinforced epoxy resin prepreg, as described in Example 1, cured, and tested by shearing the finished laminate, the loss of the paper layer was reduced compared to a standard laminate made in the same way but containing none of the Paraloid particles.

EXAMPLE 3

The procedures of Example 2 were repeated except that the amount of Paraloid EXL 2691 was varied and for one test a cotton linter paper was substituted for the Kraft paper core. The results of a series of tests carried out on a commercial scale are reported in the table below, compared with a laminate containing no Paraloid particles and another laminate in which 2 wt. % of Hycar (B.F. Goodrich) was substituted for the Paraloid particles.

TABLE A

| Laminate Type | Cavity Depth, mil (mm) | |
| --- | --- | --- |
| | Longitudinal | Transverse |
| Control - Kraft paper without Paraloid 2691 | Ave. 10.1 (0.257) | Ave. 6.0 (0.152) |
| Kraft paper +2% Hycar without Paraloid 2691 | Ave. 8.1 (0.206) | Ave. 4.6 (0.117) |
| Kraft paper +15% Paraloid 2691 | Ave. 2.8 (0.071) | Ave. 2.4 (0.061) |
| Kraft paper +12.8% Paraloid 2691 | Ave. 1.5 (0.038) | Ave. 1.5 (0.038) |
| Cotton Linter paper +12.8% Paraloid 2691 | Ave. 2.1 (0.053) | Ave. 1.5 (0038) |

It can be seen that the depth of the cavity in the paper layer produced by shearing is much reduced when Paraloid particles are added to the epoxy varnish used to impregnate the paper core of the laminate. However, the addition of an elastomeric material (Hycar) did not have nearly as large an effect. Thus, it can be concluded that addition of the rubbery material in the form of discrete particles, as in the Paraloid 2691 is clearly preferred when reduction in dusting is needed.

EXAMPLE 4

The procedures of Example 2 are repeated except that talc (Nytal 400 μm, R.T. Vanderbilt) is added to replace a portion of the Paraloid EXL 2691.

The invention claimed is:

1. A method of reducing dust formation during manufacture of printed circuit boards from metal foil clad epoxy resin containing insulating substrates incorporating in an insulating substrate more than zero and up to 25 wt. % of polymeric particles having an average diameter of about 0.05 to 30 μm.

2. The method of claim 1 wherein said particles have an average diameter of about 0.05 to 5 μm.

3. The method of claim 1 wherein said polymeric particles are core-shell particles.

4. The method of claim 3 wherein said metal foil clad epoxy resin containing insulating substrates further comprise inorganic filler particles.

5. The method of claim 3 wherein said core-shell particles comprise a core of butadiene polymer and a shell of methacrylate polymer.

6. The method of claim 5 wherein about 3 to about 20 wt. % of said particles are added to epoxy resin and cured to form an insulating substrate.

7. The method of claim 6 wherein said epoxy resin containing said particles is applied to paper reinforcing material, cured, and used in manufacture of said printed circuit boards.

8. The method of claim 7 wherein said cured paper reinforcing material containing said epoxy resin is covered with glass fiber reinforced epoxy resin outer layers.

9. The method of claim 8 wherein said cured paper reinforcing material containing epoxy resin and covered with said outer layers of glass fiber reinforced epoxy resin is CEM-1.

10. A laminate for use in printed circuit boards comprising an insulating substrate comprising paper coated with cured epoxy resin containing more than zero and up to 25 wt. % of polymeric particles having an average diameter of about 0.05 to 30 μm and covered with glass fiber reinforced epoxy resin.

11. The laminate of claim 10 wherein said particles have an average diameter of about 0.05 to 5 μm.

12. The laminate of claim 10 wherein said polymeric particles are core-shell particles.

13. The laminate of claim 12 wherein said core-shell particles comprise a core of butadiene polymer and a shell of methacrylate polymer.

14. The laminate of claim 12 further comprising inorganic filler particles.

15. The laminate of claim 10 wherein said cured epoxy resin contains about 3 to about 20 wt. % of said polymeric particles.

16. The laminate of claim 10 further comprising a copper foil and designated CEM-1.

* * * * *